(12) United States Patent
Kojima

(10) Patent No.: US 7,535,097 B2
(45) Date of Patent: May 19, 2009

(54) SEMICONDUCTOR DEVICE AND METHOD OF MANUFACTURING THE SAME

(75) Inventor: Kazuaki Kojima, Nagano (JP)

(73) Assignee: Olympus Corporation, Tokyo (JP)

( * ) Notice: Subject to any disclaimer, the term of this patent is extended or adjusted under 35 U.S.C. 154(b) by 98 days.

(21) Appl. No.: 11/799,180

(22) Filed: May 1, 2007

(65) Prior Publication Data

US 2007/0262381 A1 Nov. 15, 2007

(30) Foreign Application Priority Data

May 11, 2006 (JP) ............................ 2006-133060

(51) Int. Cl.
*H01L 23/12* (2006.01)
(52) U.S. Cl. .................. 257/704; 257/433; 438/106
(58) Field of Classification Search ................ 257/704, 257/434, 81, 99, 100, 433, 787; 438/26, 438/106, 116, 127
See application file for complete search history.

(56) References Cited

U.S. PATENT DOCUMENTS

| | | | |
|---|---|---|---|
| 6,750,479 B2 * | 6/2004 | Haag | 257/99 |
| 6,890,834 B2 * | 5/2005 | Komobuchi et al. | 438/455 |
| 7,012,315 B1 * | 3/2006 | Campbell | 257/433 |
| 7,045,868 B2 * | 5/2006 | Ding et al. | 257/414 |
| 7,180,149 B2 * | 2/2007 | Yamamoto et al. | 257/434 |
| 7,250,663 B2 * | 7/2007 | Campbell | 257/433 |
| 2005/0056903 A1 * | 3/2005 | Yamamoto et al. | 257/433 |
| 2008/0157250 A1 * | 7/2008 | Yang et al. | 257/433 |

FOREIGN PATENT DOCUMENTS

| | | |
|---|---|---|
| JP | 2005-019966 | 1/2005 |
| KR | 10-0609121 | 8/2006 |

* cited by examiner

*Primary Examiner*—S. V Clark
(74) *Attorney, Agent, or Firm*—Scully, Scott, Murphy & Presser, P.C.

(57) ABSTRACT

A semiconductor device includes a semiconductor chip having at least an electrode pad and a device formed on a semiconductor layer on its surface, a seal cap having a recess portion facing the device which is adhered to the surface of the semiconductor chip, and a cavity as an airspace formed by the recess portion between the semiconductor chip and the seal cap. The semiconductor chip includes a stepped portion at a portion of the back surface opposite the surface to have an uneven thickness.

14 Claims, 6 Drawing Sheets

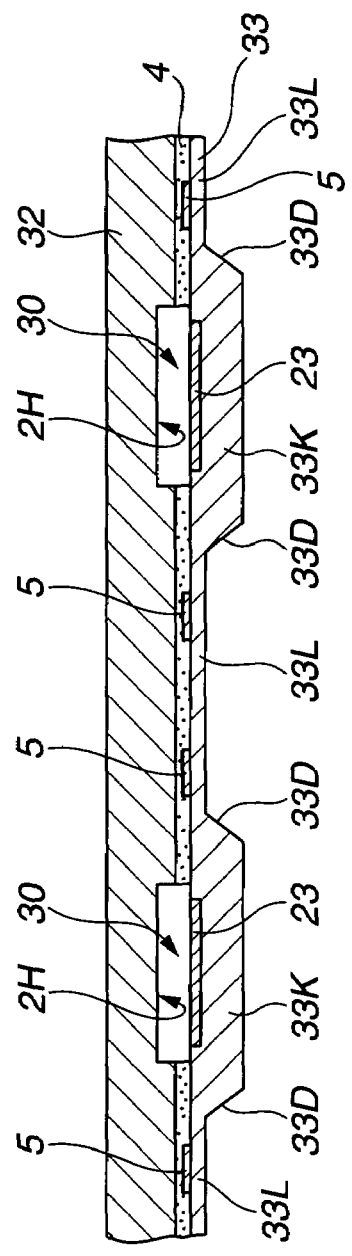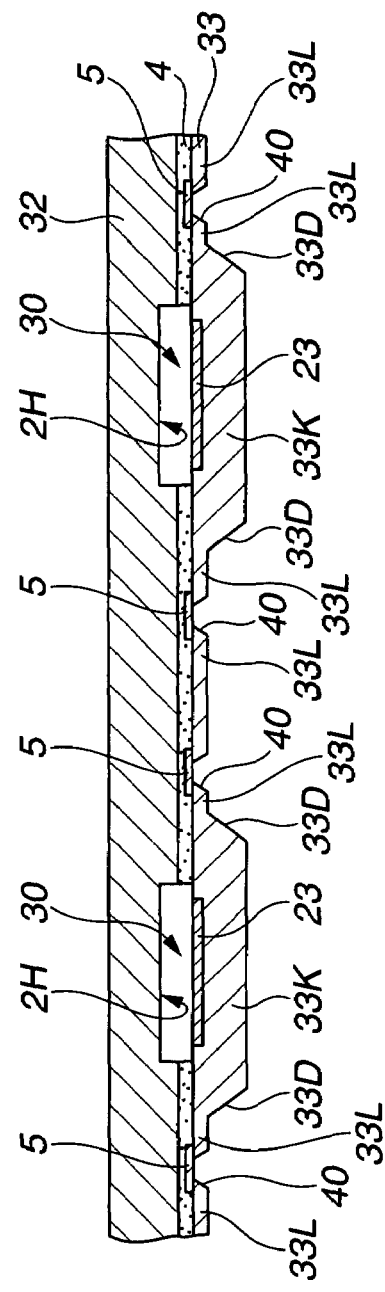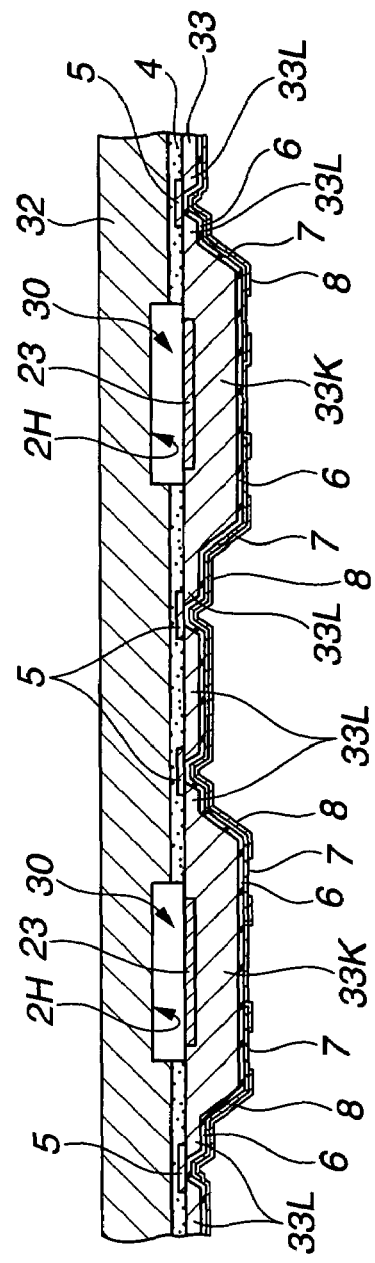

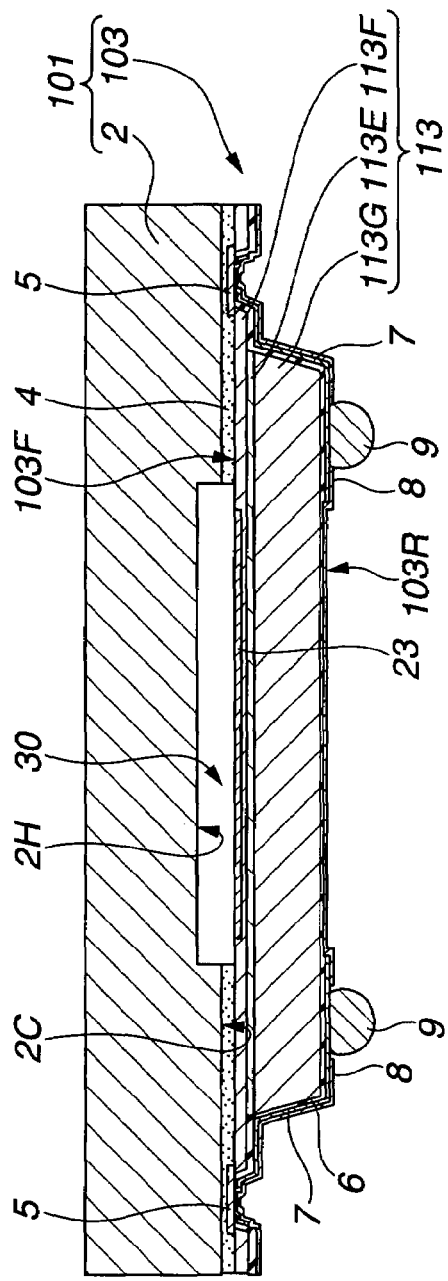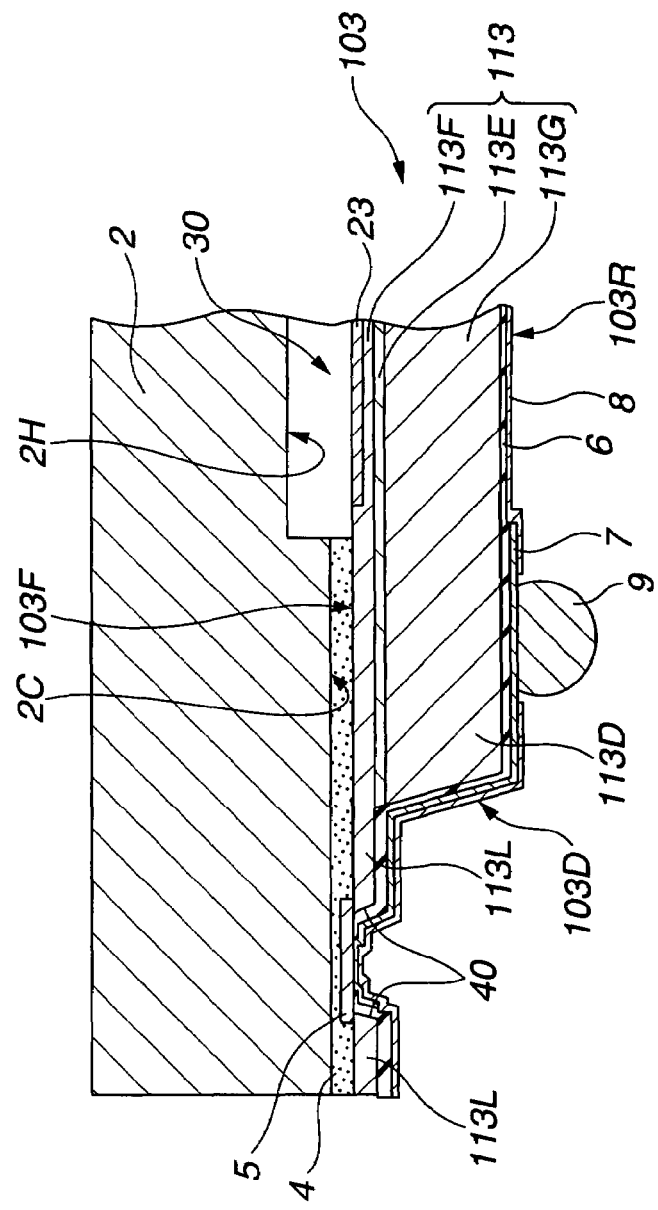
FIG. 12
FIG. 13

SEMICONDUCTOR DEVICE AND METHOD OF MANUFACTURING THE SAME

CROSS REFERENCE TO RELATED APPLICATION

This application claims benefit of Japanese Application No. 2006-133060 filed on May 11, 2006 the contents of which are incorporated by this reference.

BACKGROUND OF THE INVENTION

1. Field of the Invention

The present invention relates to a semiconductor device including a semiconductor chip, a seal cap which is adhered to the semiconductor chip and includes a recess portion, and an air seal portion defined by the semiconductor chip and the recess portion of the seal cap, which is packaged into a chip size, and a method of manufacturing the semiconductor device.

2. Description of Related Art

Recently, the compact electronic device such as the cell phone and digital audio player has been increasingly demanded. Various parts to be built in the compact electronic device are required to be compact conforming to the trend of further reducing the size of the electronic device.

In consideration of the aforementioned trend, the electronic device represented by the solid image pickup device and the device using micro-electro-mechanical-system technology represented by the acceleration sensor (hereinafter referred to as MEMS device) have been under rapid development.

The chip size package (CSP), especially, the wafer level chip size package (WL-CSP) formed by adhering the substrate to be formed as the known cap to the semiconductor substrate that forms the element to be diced into the individual device has been increasingly developed.

For example, the wafer level chip size package includes a semiconductor wafer 230A having a plurality of MEMS devices 211A and semiconductor chips 210A with wiring formed thereon, and a cap array wafer 240A having a plurality of seal caps 220A as shown in FIG. 14. The wafer level chip size package is formed by adhering the semiconductor wafer 230A to the cap array wafer 240A as shown in FIG. 15 such that the MEMS devices 211A are sealed with the resultant cavities CV, respectively.

FIG. 14 is a view showing the state where the conventionally employed semiconductor wafer is placed opposite the cap array wafer. FIG. 15 is a view showing the state where the semiconductor wafer and the cap array wafer as shown in FIG. 14 are adhered.

Referring to FIG. 16, the semiconductor wafer 230A has a plurality of via-holes 213 each vertically formed from the back surface to be below the wiring on the upper surface of the semiconductor wafer 230A. The wiring on the upper surface is connected to a bump electrode 215 formed on the back surface via a buried electrode 214 formed in each of the via-holes 213. The adhered wafers 230A and 240A are diced along the scribe lines L and L', respectively so as to produce a plurality of semiconductor devices each as an individual package.

FIG. 16 is a view showing a state where the via-holes, the buried electrode, and the bump electrode are formed on the semiconductor wafer shown in FIG. 15.

The thus produced semiconductor device and the method of manufacturing the semiconductor device are disclosed in Japanese Unexamined Patent Application Publication No. 2005-19966, for example.

The aforementioned method of manufacturing the semiconductor device as described above allows its manufacturing step to be simplified, thus reducing manufacturing cost of the package, making the package compact, and further improving the reliability.

SUMMARY OF THE INVENTION

The semiconductor device according to the present invention includes a semiconductor chip having at least an I/O electrode pad and a device formed on a semiconductor layer on its surface, a seal cap adhered to the surface of the semiconductor chip, having a recess portion formed at a position opposite the device, and an air seal portion as an airspace formed by the recess portion between the semiconductor chip and the seal cap, wherein the semiconductor chip has a stepped portion formed at a portion of a back surface opposite the surface to have an uneven thickness.

The method of manufacturing the semiconductor device according to the present invention includes adhering a semiconductor wafer which forms a semiconductor chip having at least an I/O electrode pad and a device on a semiconductor layer on its surface and a cap wafer which forms a seal cap partially having a recess portion such that the recess portion faces the device to form an airspace by the recess portion between the semiconductor chip and the seal cap, grinding an entire surface of a back surface of the semiconductor wafer until a thickness of the semiconductor wafer reaches a predetermined value, and reducing a thickness of a portion of the semiconductor wafer at least below the I/O electrode pad to be smaller than a thickness of the other portion of the semiconductor wafer by forming a stepped portion on the back surface of the semiconductor wafer.

The above and other objects, feature and advantages of the invention will become more clearly understood from the following description referring to the accompanying drawings.

BRIEF DESCRIPTION OF THE DRAWINGS

FIG. 6 is a sectional view showing the first embodiment of the present invention in a thickness reducing process of reducing a thickness of a portion of the semiconductor wafer below the electrode pad shown in FIG. 5;

FIG. 7 is a sectional view showing the first embodiment of the present invention in a via-hole forming step of forming the via-hole in the thin portion of the semiconductor wafer below the electrode pad shown in FIG. 6;

FIG. 8 is a sectional view showing the first embodiment of the present invention in a step of forming an insulation film, a back surface wiring, and a protective film on an exposed surface of the electrode pad and the back surface of the semiconductor wafer shown in FIG. 7;

FIG. 12 is a sectional view of the semiconductor device according to a second embodiment of the present invention;

FIG. 13 is a partially enlarged sectional view of the semiconductor device according to the second embodiment of the present invention around the stepped portion of the semiconductor chip shown in FIG. 12;

DETAILED DESCRIPTION OF THE PREFERRED EMBODIMENTS

Figure 1:
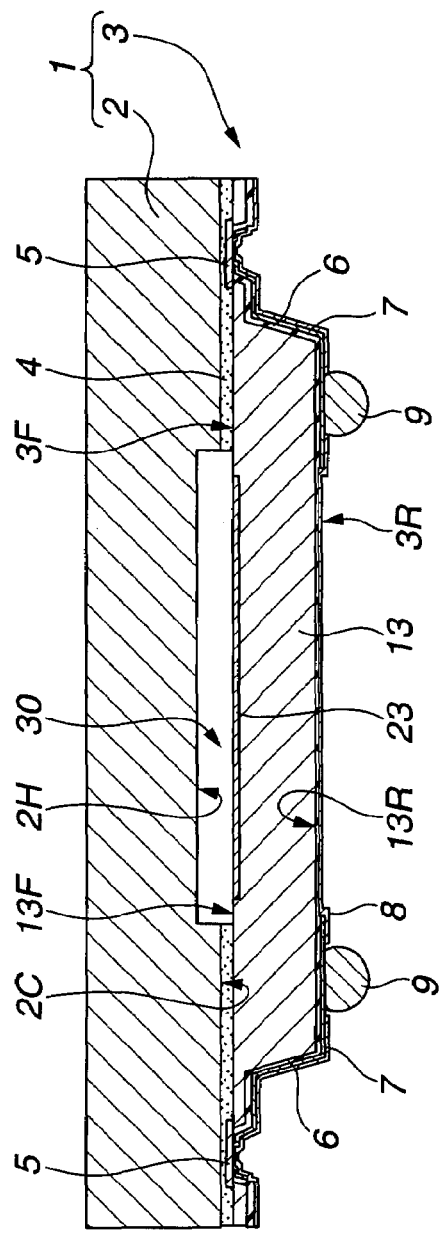
FIG. 1 is a sectional view of a semiconductor device according to a first embodiment of the present invention.

Embodiments of the present invention will be described referring to the drawings.

First Embodiment

Figure 2:
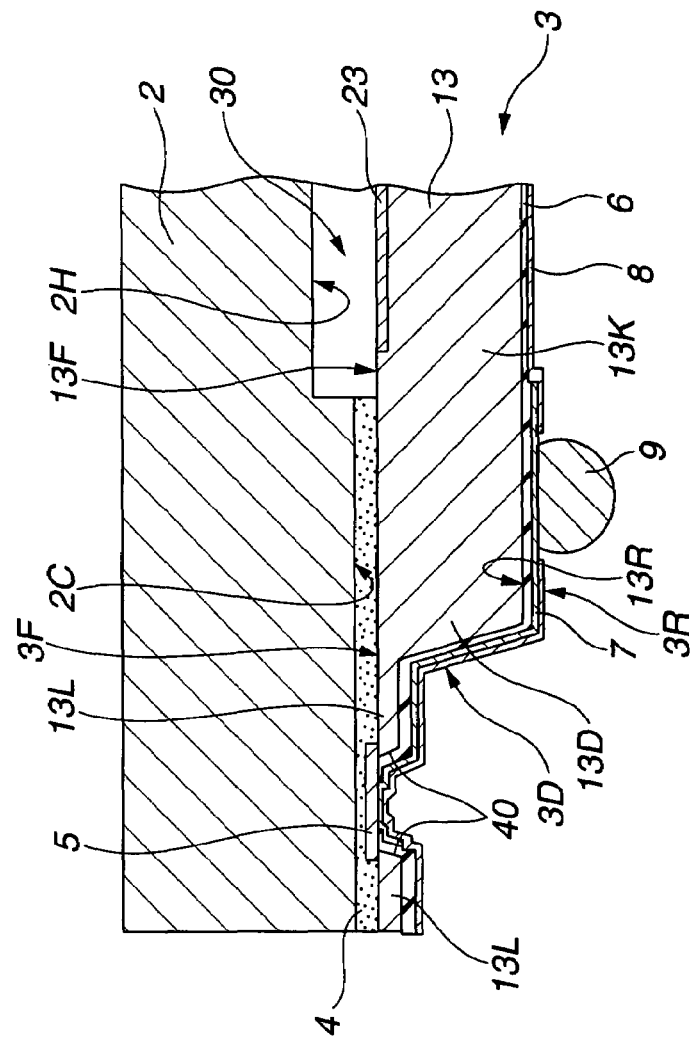
FIG. 2 is a partially enlarged sectional view of the semiconductor device according to the first embodiment of the present invention around a stepped portion of the semiconductor chip shown in FIG. 1.

FIGS. 1 and 2 show a first embodiment of the present invention. FIG. 1 is a sectional view of a semiconductor device, and FIG. 2 is a partially enlarged sectional view of the semiconductor device around a stepped portion of a semiconductor chip shown in FIG. 1.

Referring to FIGS. 1 and 2, a semiconductor device 1 is mainly formed by adhering a seal cap 2 onto an opposite semiconductor chip 3 via an adhering layer 4. The seal cap 2 has substantially the same size as that of the semiconductor chip 3 in a planar view.

The seal cap 2 may be formed of such material as quartz, glass, resin, silicon and ceramics in the form of a solid structure of a single member. Alternatively it may be formed of a plurality of members.

A recess portion 2H is formed in the seal cap 2 at a position of an adhered surface 2C opposite the device 23 (described later) of the semiconductor chip 3 so as to cover the device 23 on the planar surface.

The thus formed recess 2H serves to form an air seal portion (hereinafter referred to as a cavity) 30 at a portion including the device 23 between the seal cap 2 and the semiconductor chip 3 which have been adhered by the adhering layer 4.

The cavity 30 may be in the air-tight, that is, vacuum state. Alternatively, it may be filled with inert gas.

In the case where the seal cap 2 is formed of a member which exhibits the optical property, for example, a glass material, an optical film such as an antireflective film may be coated onto the recess portion 2H, that is, the inner surface of the cavity 30.

The semiconductor chip 3 includes a semiconductor layer 13, a device 23, an I/O electrode pad (hereinafter referred to as an electrode pad) 5, an insulation film 6, a back-surface wiring 7, a protective film 8, and an external connection terminal 9.

More specifically, the semiconductor layer 13 as a surface 3F of the semiconductor chip 3 is formed of a semiconductor material, for example, silicon, gallium arsenic, and the like. The device 23 is formed on an active region of the surface 13F having its planar surface covered with the recess portion 2H of the seal cap 2. In other words, the device 23 is sealed within the cavity 30. The electrode pads 5 for I/O signals are formed around the device 23 on the surface 13F.

The device 23 may be formed of an image pickup device, for example, MEMS device, CCD, and CMOS sensor, or an IC of general type. However, it may be formed of an arbitrary device without being limited to those described above.

The semiconductor layer 13 is formed to have its thickness uneven on the planar surface. Specifically, referring to FIG. 2, the thickness of the semiconductor layer at a position 13L below the electrode pad 5 is set to be small ranging from several 10 µm to 100 µm, which is smaller than that of the other portion of the semiconductor layer 13, especially, the portion 13K of the semiconductor layer below the active region where the device 23 is formed. The thickness of the position of the semiconductor layer other than the 13L, that is, the 13K is set to range from 300 µm to 500 µm.

A back surface 13R of the semiconductor layer 13 is formed into a step-like shape, which has a taper portion 13D as a stepped portion around the portion below the electrode pad 5.

A via-hole 40 having a tapered cross section is formed in a portion 13L of the semiconductor layer 13 to vertically pierce therethrough such that at least a portion of the electrode pad 5 is exposed. The cross section of the via-hole 40 is not limited to the tapered shape but may be formed into a vertical shape.

The insulation film 6 is formed on the back surface 13R of the semiconductor layer 13 and the inner wall of the via-hole 40. The back-surface wiring 7 is formed on a portion of the back surface of the insulation film 6, and the surface of the electrode pad 5 which has been exposed by the via-hole 40. The insulation film 6 and the back-surface wiring 7 partially protrude into the via-hole 40 from the cross sectional view.

The insulation film 6 serves to insulate the semiconductor layer 13 from the back-surface wiring 7. The back-surface wiring 7 electrically coupled with the electrode pad 5 through the via-hole 40 is formed from the electrode pad 5 to the back surface of the insulation film 6. Alternatively, the conducting material may be filled into the via-hole 40 so as to serve as the wiring in place of the back-surface wiring 7.

The external connection terminal 9 as the bump formed of the conducting material such as gold and solder is provided to a portion of the back-surface wiring 7 so as to be electrically coupled with the outside of the semiconductor device 1.

The protective film 8 is applied on the portion of the back-surface wiring 7 except the portion to which the external connection terminal 9 is attached, and on the surface of the insulation film 6 where the back-surface wiring 7 is not formed such that the back-surface wiring 7 and the insulation film 6 where the back-surface wiring 7 is not formed are protected from the flaw and corrosion. The protective film 8 is also formed to partially protrude into the via-hole 40 from the cross sectional view.

The insulation film 6, the back-surface wiring 7, and the protective film 8 are step-like shaped along the contour of the back surface 13R of the semiconductor layer 13. The back surface 3R of the semiconductor chip 3 has the step-like shape having the tapered portion 3D with uneven thickness on the planar surface.

Preferably the adhering layer 4 is formed of an epoxy resin adhesive agent or a silicon resin adhesive agent. The adhesive agent may be clear or colored. The semiconductor chip 3 is adhered to the seal cap 2 with the adhering layer 4 in the region other than the active region where at least the device 23 of the semiconductor chip 3 is formed, preferably on the electrode pad 5.

In the case where the cavity 30 is evacuated or the inert gas is filled into the cavity 30, it is preferable to perform the mechanical adhesion of the semiconductor chip 3 and the seal cap 2 rather than using the resin adhesive agent.

The method of manufacturing the above-structured semiconductor device 1 will be briefly described referring to FIGS. 3 to 11.

Figure 3:
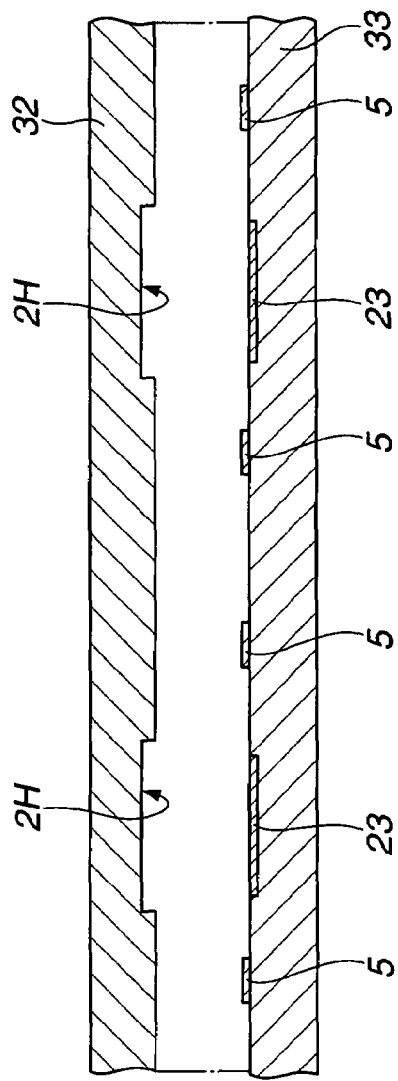
FIG. 3 is a sectional view showing the first embodiment of the present invention in a step where a semiconductor wafer is placed opposite the cap wafer.
Figure 4:
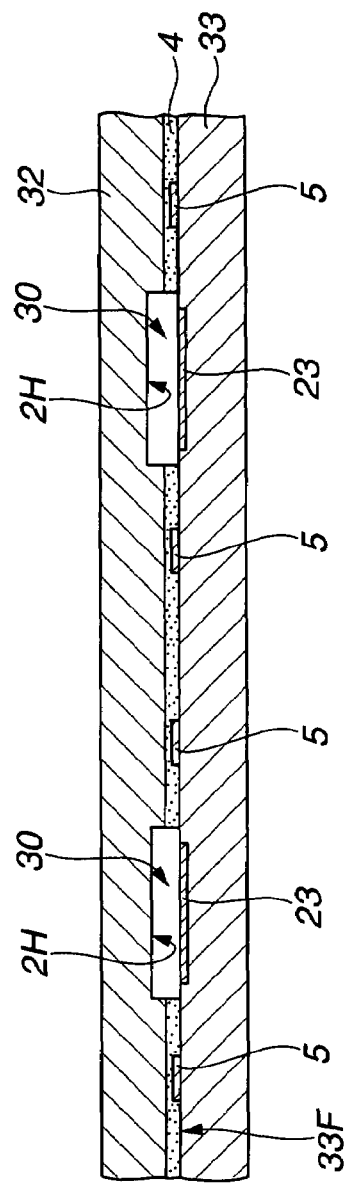
FIG. 4 is a sectional view showing the first embodiment of the present invention in an adhering step of adhering the cap wafer to the opposite semiconductor wafer shown in FIG. 3.
Figure 5:
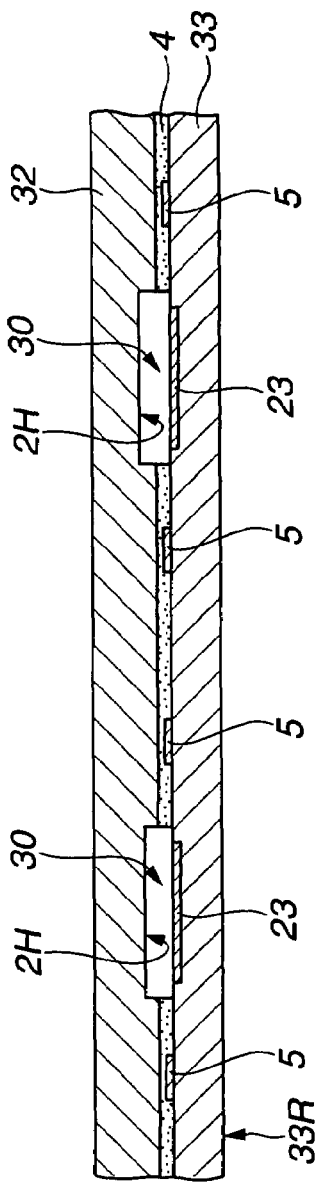
FIG. 5 is a sectional view showing the first embodiment of the present invention in a grinding step of further grinding the back surface of the semiconductor wafer shown in FIG. 4 until the thickness reaches the predetermined value.

FIG. 3 is a sectional view showing the step of placing the semiconductor wafer and the cap wafer to face with each other. FIG. 4 is a sectional view showing the adhering step of adhering the cap wafer to the opposite semiconductor wafer shown in FIG. 3. FIG. 5 is a sectional view showing the grinding step of grinding the back surface of the semiconductor wafer shown in FIG. 4 until the thickness reaches the predetermined value.

FIG. 6 is a sectional view showing the thickness reducing step of reducing the thickness of the portion of the semiconductor wafer below the electrode pad shown in FIG. 5. FIG. 7 is a sectional view showing a via-hole forming step to form a via-hole in the portion of the semiconductor wafer having the reduced thickness below the electrode pad shown in FIG. 6. FIG. 8 is a sectional view showing a step of forming the insulation film, the back-surface wiring and the protective film on the exposed surface of the electrode pad and on the back surface of the semiconductor wafer as shown in FIG. 7.

Figure 9:
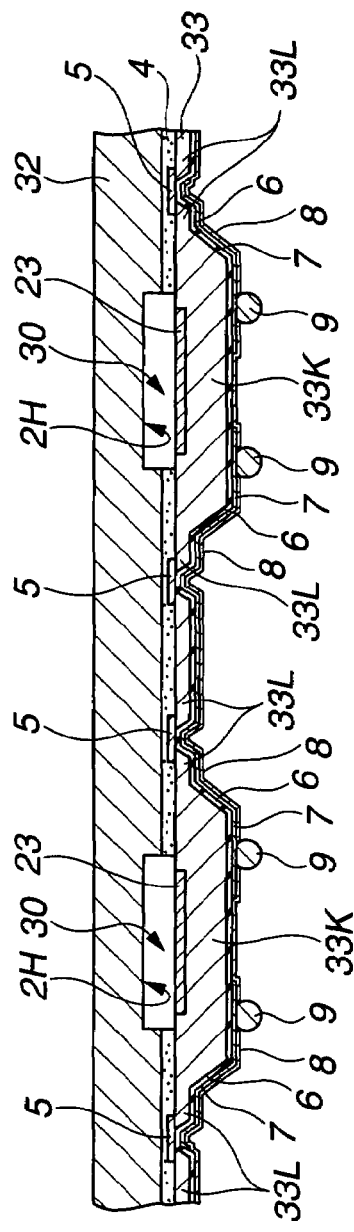
FIG. 9 is a sectional view showing the first embodiment of the present invention in an external connection terminal forming step of forming an external connection terminal on a portion of the back-surface wiring shown in FIG. 8.
Figure 10:
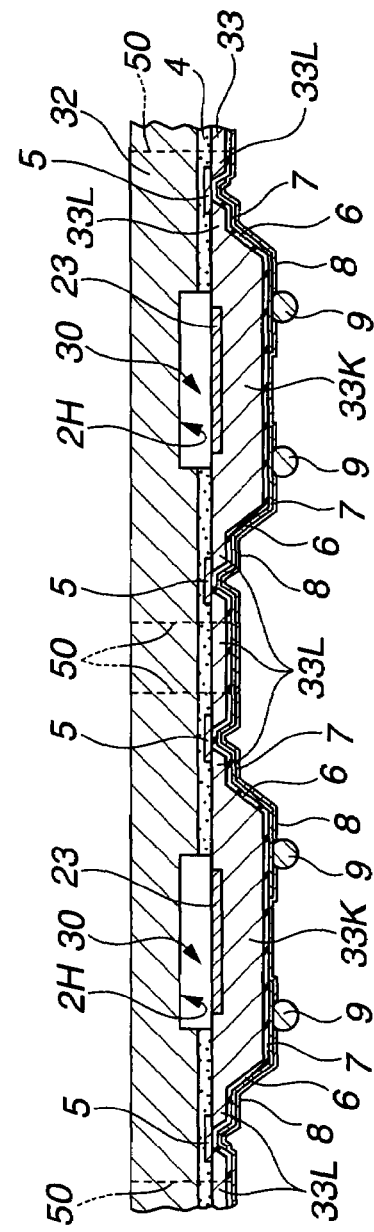
FIG. 10 is a sectional view showing the first embodiment of the present invention in a dividing step of dividing the semiconductor chip and the seal cap from the semiconductor wafer and the cap wafer shown in FIG. 9.
Figure 11:
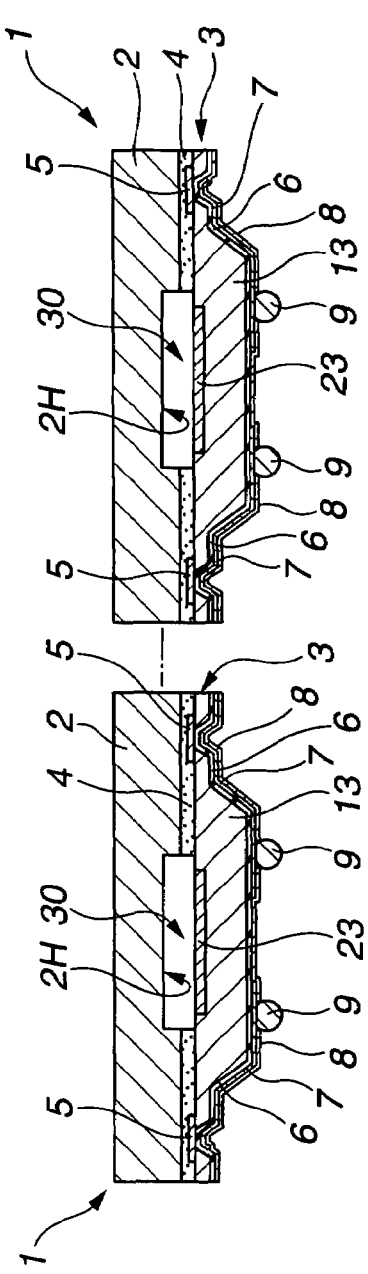
FIG. 11 is a sectional view showing the first embodiment of the present invention where each of the semiconductor devices divided in the dividing process shown in FIG. 10 is packaged into the chip size.
Figure 14:
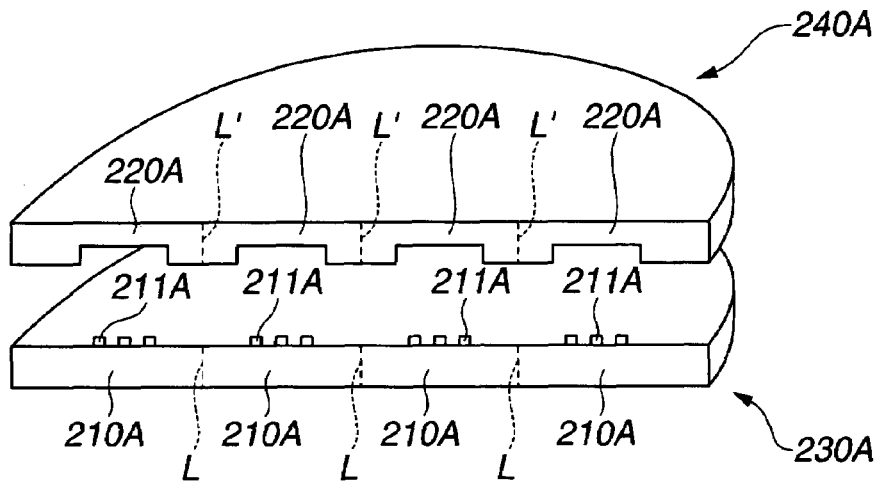
FIG. 14 is a view showing the state where the conventionally employed semiconductor wafer is placed opposite the cap array wafer.
Figure 15:
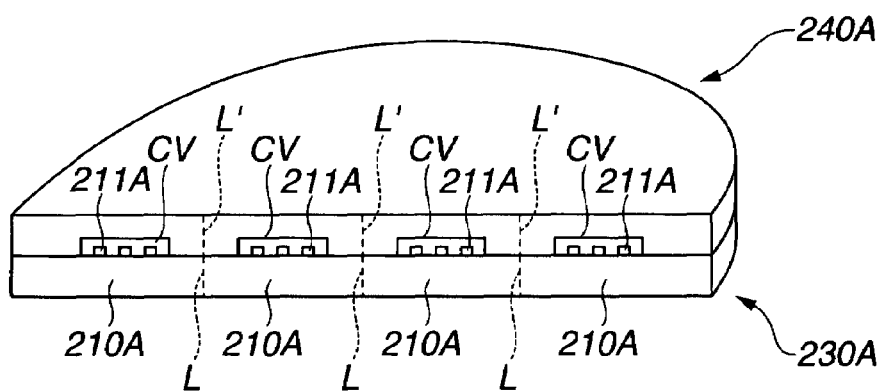
FIG. 15 is a view showing a state where the conventionally employed semiconductor wafer shown in FIG. 14 is adhered to the cap array wafer.
Figure 16:
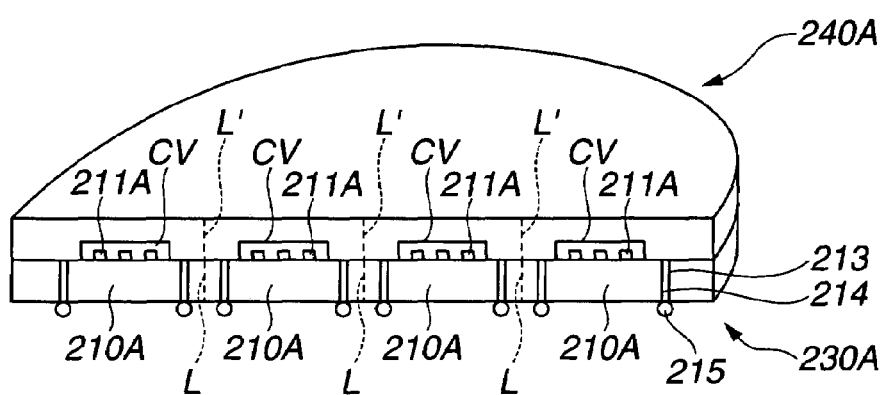
FIG. 16 is a view showing a state where the conventionally employed via-holes, buried electrode, and bump electrode are formed on the semiconductor wafer shown in FIG. 15.

FIG. 9 is a sectional view showing an external connection terminal forming step of forming the external connection terminal on a portion of the back-surface wiring shown in FIG. 8. FIG. 10 is a sectional view showing a dividing step of dividing the semiconductor chip and the seal cap from the semiconductor wafer and the cap wafer shown in FIG. 9, respectively. FIG. 11 is a sectional view showing the respective semiconductor devices obtained through the dividing step shown in FIG. 10, each packaged into the chip size.

The manufacturing method will be described taking simultaneous manufacturing of two semiconductor devices 1 as the example.

First, referring to FIG. 3, the semiconductor wafer 33 and the seal cap wafer 32 are placed to face with each other. In the present embodiment shown in the drawing, the semiconductor wafer 33 includes two semiconductor chips 3 to be produced, each of which the device 23 and the electrode pad 5 are formed in a predetermined manner. The seal cap wafer 32 includes two seal caps 2 to be produced, each of which has the recess portion 2H to form the cavity 30. The semiconductor wafer 33 is designed to form the semiconductor layer 13 of the semiconductor chip 3, and the seal cap wafer 32 is designed to form the seal cap 2.

Next, referring to FIG. 4, the adhering step is performed by adjusting the position of the seal cap wafer 32 to the adhering position with the CCD camera so as to be adhered onto the surface 33F of the opposite semiconductor wafer 33 via the adhering layer 4 formed of the resin adhesive.

In the adhering step, as described above, the adhering layer 4 is applied to the region other than the active region where at least the device 23 of the semiconductor wafer 33 is formed. Adhesion of the seal cap wafer 32 to the semiconductor wafer 33 forms the cavity 30 as the airspace between the semiconductor wafer 33 and the seal cap wafer 32.

During the adhering step of the manufacturing process, an inert gas filling step to fill the inert gas into the cavity 30 or an evacuating step to evacuate the cavity 30 into air-tight, that is, vacuum state may be conducted.

Next, referring to FIG. 5, the grinding step is performed to grind the back surface 33R of the semiconductor wafer 33 such that the back surface 33R is ground until the thickness reaches the predetermined value which allows the semiconductor wafer 33 to maintain the mechanical strength, for example, from 300 µm to 500 µm.

Next, referring to FIG. 6, the thickness reducing step is performed to reduce the thickness of the portion 33L of the semiconductor wafer 33 below the electrode pad 5 to the value from several 10 µm to 100 µm through wet etching or dry etching.

At this time, the etching is performed to form the taper portion 33D as a stepped portion around the planar portion below the electrode pad 5 on the back surface 33R of the semiconductor wafer 33.

Consequently, the portion 33L of the semiconductor wafer 33 below the electrode pad 5 is formed to have its thickness ranging from several 10 µm to 100 µm, for example. The portion 33K other than the portion 33L is formed to have its thickness ranging from 300 µm to 500 µm, for example.

Next, referring to FIG. 7, the via-hole forming step is performed to form the via-hole 40 having the tapered cross section in the portion 33L of the semiconductor wafer 33 so as to pierce therethrough at the electrode pad 5. The electrode pad 5, thus, is partially exposed by the via-hole.

Next, referring to FIG. 8, the insulation film forming step is performed to apply the insulation film 6 on the back surface 33R of the semiconductor wafer 33, the inner wall of the via-hole 40, and the surface of the electrode pad 5 exposed by the via-hole 40. An insulation film removing step is performed to remove the insulation film 6 below the electrode pad 5 by forming a contact hole that pierces through the insulation film 6 within the via-hole 40.

Thereafter, the back-surface wiring forming step is performed to form the back-surface wiring 7 on the back surface of the insulation film 6, and the surface of the electrode pad 5 exposed by the contact hole. Then the protective film forming step is performed to form the protective film 8 on the back surface of the back-surface wiring 7 and a portion of the back surface of the insulation film 6.

Next, referring to FIG. 9, the external connection terminal 9 such as a bump formed of the conducting material, for example, gold and solder is formed on the back-surface wiring 7 through an opening formed in an appropriate position of the protective film 8 on the back-surface wiring 7.

Next, referring to FIG. 10, scribe lines 50 are formed on the semiconductor wafer 33 and the seal cap wafer 32 to define each size of the respective semiconductor devices 1 using a scribe line cutter, for example.

Last of all, referring to FIG. 11, the dividing step is performed to divide the adhered semiconductor chip 3 and the seal cap 2 from the adhered semiconductor wafer 33 and the seal cap wafer 32 along the scribe line 50 through scribe breaking or dicing. The thus divided semiconductor device 1 is packaged into the chip size.

In the aforementioned manufacturing process steps, two semiconductor devices 1 may be formed simultaneously. In the aforementioned embodiment, two semiconductor devices are simultaneously produced. However, the manufacturing method may be designed to produce a single semiconductor device or three or more semiconductor devices simultaneously.

In the present embodiment, the planar surface of the semiconductor layer 13 of the semiconductor chip 3 of the semiconductor device 1 is configured to make the thickness uneven.

More specifically, the portion 13L of the semiconductor layer 13 below the electrode pad 5 has a thickness ranging from several 10 μm to 100 μm, which is smaller than that of the portion 13K of the semiconductor layer below the active region where the device 23 is formed ranging from 300 μm to 500 μm. That is, the back surface 13R of the semiconductor layer 13 is step-like shaped, which has the taper portion 13D as the stepped portion formed around the position below the electrode pad 5.

Thus, the small thickness of the portion 13L allows the via-hole 40 to be easily formed therein, and the insulation film 6, the back-surface wiring 7 and the protective film 8 to be easily formed to protrude into the via-hole 40.

The portion 13K of the semiconductor layer 13 has a large thickness to allow each mechanical length of the semiconductor layer 13 and the cavity 30 to be maintained.

As described above, the semiconductor wafer 33 is allowed to be easily processed to form the semiconductor chip 3 while maintaining the mechanical strength of the semiconductor layer 13 and the cavity 30, resulting in the improved yield of the semiconductor device 1 in the manufacturing process.

In the present embodiment, the cap wafer 32 and the semiconductor wafer 33 are adhered together, and divided into the semiconductor devices 1, each of which is packaged into the chip size.

Thus, the semiconductor device 1 may be made compact, and mass produced. This makes it possible to reduce the manufacturing cost of the semiconductor device.

In addition, in the embodiment, the cavity 30 is evacuated or filled with the inert gas.

This makes it possible to improve reliability of the device 23, specifically, to elongate the life of the MEMS device.

Second Embodiment

FIG. 12 is a sectional view of the semiconductor device according to a second embodiment of the present invention. FIG. 13 is a partially enlarged sectional view of the semiconductor device around the stepped portion of the semiconductor chip shown in FIG. 12.

The structure and the manufacturing method of the semiconductor device according to the second embodiment are substantially the same as the semiconductor device shown in FIGS. 1 and 2, and the manufacturing method of the semiconductor device 1 shown in FIGS. 3 to 11 except that the use of the SOI substrate having an oxide film layer which defines the thickness of the thin portion of the semiconductor layer formed therein, and formation of the thin portion in the semiconductor layer by performing the etching to the oxide film layer. Accordingly, the semiconductor device according to the second embodiment will be described with respect to the aforementioned different points. The same components as those of the first embodiment will be designated with the same reference numerals, and the explanations thereof, thus will be omitted.

Referring to FIGS. 12 and 13, in the present embodiment, the SOI (Silicon On Insulator) substrate is used for the semiconductor layer 113 of the semiconductor chip 103 of the semiconductor device 101. That is, the semiconductor layer 13 has the SOI substrate structure.

The semiconductor layer 113 has an intermediate oxide film layer (hereinafter referred to as an oxide film layer) 113E as a small thickness defining layer superimposed on a support layer 113G, and further has an active layer 113F superimposed on the oxide film layer 113E. The active layer 113F forms a surface 103F of the semiconductor chip 103.

The oxide film layer 113E defines the thickness of the active layer 113F of the semiconductor layer 113. Specifically, the thickness of the portion 113L of the active layer 113F of the semiconductor layer 113 below the electrode pad 5 is set from several 10 μm to 100 μm which is smaller than that of the support layer 113G as the other portion of the semiconductor layer 113.

Likewise the first embodiment, the support layer 113G is ground until the thickness reaches the predetermined value, for example, ranging from 300 μm to 500 μm. The support layer 113G does not have to be unnecessarily ground.

Other structure of the semiconductor device 101 is the same as that of the semiconductor device 1 according to the first embodiment, and explanation thereof, thus will be omitted.

Thus, in the present embodiment, the semiconductor layer 113 includes the oxide film layer 113E which serves as an etching stop film when the thin portion 113L is formed on the semiconductor layer 113 through the etching process. This may prevent the etching of the thin portion 113L excessively to exceed the set amount. This makes it possible to easily form the taper portion 113D as the stepped portion on the semiconductor layer 113 uniformly irrespective of the position.

In other words, the taper portion 103D as the stepped portion may be easily formed on the back surface 103R of the semiconductor chip 103.

The other feature of the manufacturing method of the semiconductor device 101 according to the present embodiment is substantially the same as that of the first embodiment and the description thereof is omitted. In the present embodiment, the scribe lines 50 may be formed simultaneously with the formation of the via-holes 40. That is, the scribe line 50 is formed along the position of the via-hole 40.

Thus, the semiconductor device 101 which has been obtained after dicing along the scribe line 50 may be packaged without exposing the semiconductor layer 113 to the end surface of the semiconductor device 101. This makes it possible to process the semiconductor chip 103 easily to reduce the chipping and the like, to improve the yield of the semiconductor device 101, to improve the reliability, and to reduce the cost. The other effect derived from the embodiment may be the same as that of the first embodiment.

The present invention provides the semiconductor device and the manufacturing method of the semiconductor device which allow easy processing of the wafer while maintaining the mechanical strength of the semiconductor wafer to be formed as the semiconductor layer, and establishes the improved yield in the manufacturing steps, and the cost reduction.

Having described the preferred embodiments of the invention referring to the accompanying drawings. It should be understood that the present invention is not limited to those precise embodiments and various changes and modifications thereof could be made by one skilled in the art without departing from the spirit or scope of the invention thereof.

What is claimed is:

1. A semiconductor device comprising:
   a semiconductor chip having at least an I/O electrode pad and a device formed on a semiconductor layer on its surface;
   a seal cap adhered to the surface of the semiconductor chip, having a recess portion formed at a position opposite the device; and
   an air seal portion as an airspace formed by the recess portion between the semiconductor chip and the seal cap, wherein the semiconductor chip has a stepped portion formed at a portion of a back surface opposite the surface to have an uneven thickness.

2. The semiconductor device according to claim 1, wherein a thickness of at least a portion of the semiconductor layer below the I/O output electrode pad is smaller than that of the other portion of the semiconductor layer.

3. The semiconductor device according to claim 1, wherein the semiconductor chip includes:
   a via-hole that pierces through a portion of the semiconductor layer below the I/O electrode pad;
   a back-surface wiring formed from the I/O output electrode pad to the back surface of the semiconductor layer through the via-hole; and
   an external connection terminal formed on a portion of the back-surface wiring.

4. The semiconductor device according to claim 1 wherein the device is formed as an MEMS device.

5. The semiconductor device according to claim 1, wherein the device is formed as an image pickup device.

6. The semiconductor device according to claim 1, wherein inside of the air seal portion is kept in a vacuum state.

7. The semiconductor device according to claim 1, wherein the air seal portion is filled with inert gas.

8. The semiconductor device according to claim 1, wherein a small thickness defining layer that defines the small thickness of the semiconductor layer is formed within the semiconductor layer.

9. The semiconductor device according to claim 8, wherein:
   the semiconductor layer includes an SOI substrate structure; and
   the small thickness defining layer is an intermediate oxide film of the SOI substrate structure.

10. A method of manufacturing a semiconductor device comprising:
    adhering a semiconductor wafer which forms a semiconductor chip having at least an I/O electrode pad and a device on a semiconductor layer on its surface and a cap wafer which forms a seal cap partially having a recess portion such that the recess portion faces the device to form an airspace by the recess portion between the semiconductor chip and the seal cap;
    grinding an entire surface of a back surface of the semiconductor wafer until a thickness of the semiconductor wafer reaches a predetermined value; and
    reducing a thickness of a portion of the semiconductor wafer at least below the I/O electrode pad to be smaller than a thickness of the other portion of the semiconductor wafer by forming a stepped portion on the back surface of the semiconductor wafer.

11. The method of manufacturing a semiconductor device according to claim 10, comprising:
    forming a via-hole at a portion of the semiconductor wafer below the I/O electrode pad to pierce through the semiconductor wafer;
    forming an insulation film on an inner wall of the via-hole, a back surface of the I/O electrode pad exposed by the via-hole, and the back surface of the semiconductor wafer;
    removing the insulation film below the I/O electrode pad to expose the I/O electrode pad;
    forming a back-surface wiring on a portion of a back surface of the insulation film, an inner wall of the via-hole, and the back surface of the exposed I/O electrode pad;
    forming a protective film on a back surface of the back-surface wiring;
    forming an opening in a portion of the protective film to form an external connection terminal in a portion of the back-surface wiring via the opening; and
    dividing the adhered semiconductor chip and the seal cap from the adhered semiconductor wafer and the chip wafer so as to be packaged into a chip size.

12. The method of manufacturing a semiconductor device according to claim 10, wherein reducing a thickness of a portion of the semiconductor wafer at least below the I/O electrode pad is reduced so as to be smaller than a thickness of the other portion of the semiconductor wafer through etching.

13. The method of manufacturing a semiconductor device according to claim 10, further comprising:
    filling the air seal portion with inert gas or keeping inside of the air seal portion in a vacuum state, when adhering the semiconductor wafer and the cap wafer.

14. The method of manufacturing a semiconductor device according to claim 10, wherein an etching stop layer that defines a depth of the etching to be performed is formed within the semiconductor wafer.

* * * * *